United States Patent
Chan et al.

(10) Patent No.: US 6,897,739 B2
(45) Date of Patent: May 24, 2005

(54) WAVEGUIDE POWER DIVIDER AND COMBINER UTILIZING A RESISTIVE SLOT

(75) Inventors: Steven S. Chan, Alhambra, CA (US); Paul S. Lee, La Palma, CA (US); Chungcytz Liu, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/387,717

(22) Filed: Mar. 13, 2003

(65) Prior Publication Data

US 2004/0178863 A1 Sep. 16, 2004

(51) Int. Cl.[7] .............................................. H01P 5/12
(52) U.S. Cl. ........................ 333/127; 333/113; 333/137
(58) Field of Search ................................ 333/100, 113, 333/115, 122, 127, 137

(56) References Cited

U.S. PATENT DOCUMENTS

| | | | | |
|---|---|---|---|---|
| 3,569,868 A | * | 3/1971 | Suzuki et al. ................ | 333/137 |
| 4,182,996 A | | 1/1980 | Spence ........................ | 333/100 |
| 4,704,589 A | | 11/1987 | Moeller ....................... | 333/113 |
| 4,720,691 A | | 1/1988 | Rammos ..................... | 333/122 |
| 4,875,024 A | | 10/1989 | Roberts ....................... | 333/127 |
| 4,922,215 A | | 5/1990 | Bergero et al. ............. | 333/137 |
| 5,196,812 A | | 3/1993 | Drost et al. ................. | 333/113 |
| 5,532,661 A | * | 7/1996 | Lagerlof ..................... | 333/125 |
| 6,078,227 A | | 6/2000 | Buer et al. .................. | 333/117 |

FOREIGN PATENT DOCUMENTS

| | | | | |
|---|---|---|---|---|
| JP | 58-119202 | * | 7/1983 | ................ 333/135 |
| JP | 60-132401 | * | 7/1985 | ................ 333/135 |
| JP | 63-6904 | * | 1/1988 | ................ 333/121 |

OTHER PUBLICATIONS

The Magic–Tee by Mike Ellis, Copyright 1999, http://members.tripod.com/michaelgellis/magict.html.

* cited by examiner

*Primary Examiner*—Barbara Summons

(57) ABSTRACT

A compact inline waveguide power divider is provided that comprises a primary waveguide in communication with two parallel waveguides. The two parallel waveguides are stacked on top of one another and each parallel waveguide further comprises an output port. Accordingly, an input signal is transmitted through the primary waveguide and split between the two parallel waveguides. A resistive slot is formed in each of the parallel waveguides, thereby increasing output port isolation through dissipation of reflected power from one output port to the other. Further, a stepped or tapered impedance transformation is applied in each parallel waveguide to provide wide band frequency matching. Alternately, the primary waveguide and the parallel waveguides may be configured as a waveguide power combiner rather than a divider, wherein the parallel waveguides comprise input ports and the primary waveguide comprises an output port.

27 Claims, 3 Drawing Sheets

Sec. A-A

Sec. A-A

WAVEGUIDE POWER DIVIDER AND COMBINER UTILIZING A RESISTIVE SLOT

BACKGROUND OF THE INVENTION

The present invention relates generally to waveguides and more particularly to waveguide power dividers and combiners for high frequency systems.

Devices and methods for dividing and combining power in high frequency systems are numerous and well known in the art. Such devices and methods are employed, for example, in a transmitter for combining signals from a plurality of lower power devices to form a high power signal for transmission through a single antenna. Similarly, a signal from a single antenna may be divided into a plurality of signals for corresponding satellite or radar antennas.

Waveguides are commonly employed in the art for dividing and combining high frequency signals. Generally, a waveguide is a hollow member that transmits high frequency energy, i.e. microwave and millimeter wave, along a longitudinal axis thereof. Waveguides are available in a variety of sizes and configurations such as a "Y" or a "T," in addition to a ring hybrid, among others. For example, U.S. Pat. No. 4,720,691 to Rammos discloses a parallelipiped having an internal volume divided by partitions. The partitions form parallel input and output guides and may further be arranged to form walls of linear polarization guides having a variable cross section. Unfortunately, the rectangular guides and partitions of Rammos consume a relatively large volume and further contribute to insertion losses throughout the waveguide.

The Magic-Tee is a well known waveguide power divider and combiner, wherein output ports or input ports are positioned at 90° bends to a main axis of an apparatus. Unfortunately, Magic-Tee dividers require extensive backshort tuning at each port to minimize loss, which results in increased manufacturing costs. Furthermore, additional 90° bends are required for an inline Magic-Tee configuration, which results in the consumption of additional volume along with further insertion loss.

Accordingly, there remains a need in the art for a compact power divider and combiner that is capable of providing low loss input power dividing and combining in addition to improved port-to-port isolation without the need for extensive waveguide backshort tuning. The power divider should further be compact and inexpensive to manufacture.

BRIEF SUMMARY OF THE INVENTION

In one preferred form, the present invention provides an inline waveguide power divider comprising a primary waveguide and at least two parallel waveguides. The parallel waveguides are stacked on top of one another and receive split signals from the primary waveguide. Accordingly, the primary waveguide comprises an input port, and the parallel waveguides comprise output ports.

The waveguide power divider further comprises a resistive slot formed near the junction of the two parallel waveguides where the input signal is split. The resistive slots are employed to increase output port isolation through the dissipation of reflected power from the output ports. Further, impedance transformations, such as steps or tapers are formed in each of the parallel waveguides to replace backshort tuning and further to provide wide band frequency matching on the output ports of each parallel waveguide.

In another form, the waveguides may also be configured as a power combiner rather than a power divider, wherein the two parallel waveguides stacked on top of one another comprise input ports, and the primary waveguide comprises an output port. The resistive slots and the impedance transformations are similarly employed in the waveguide power combiner to improve performance of the waveguide as previously described. Further, any number of input ports and output ports may be employed in accordance with the present invention, and the reference to two parallel waveguides herein shall not be construed as limiting the scope of the present invention.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE INVENTION

The following description of the preferred embodiments is merely exemplary in nature and is in no way intended to limit the invention, its application, or uses.

Figure 1:
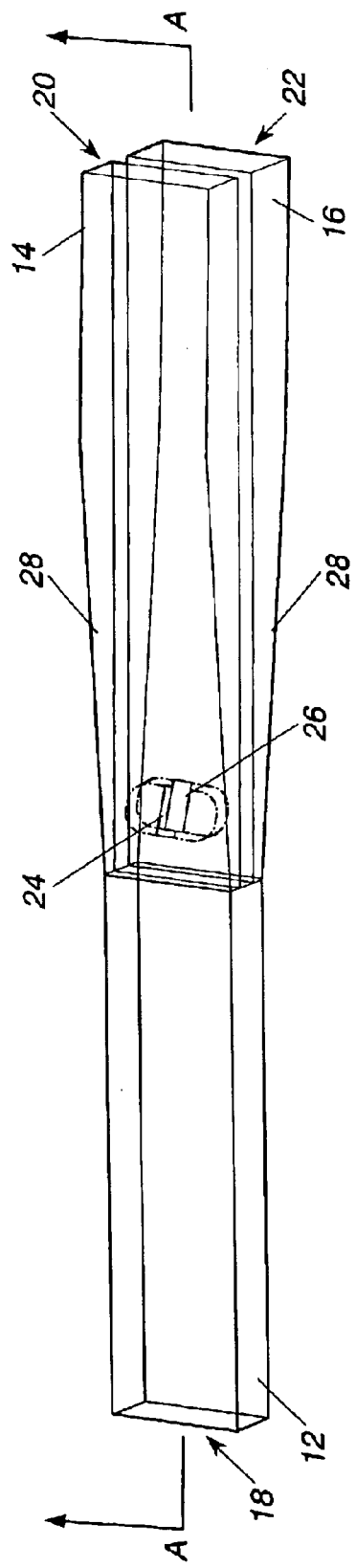
FIG. 1 is an orthogonal view of a waveguide power divider in accordance with the present invention.
Figure 2:
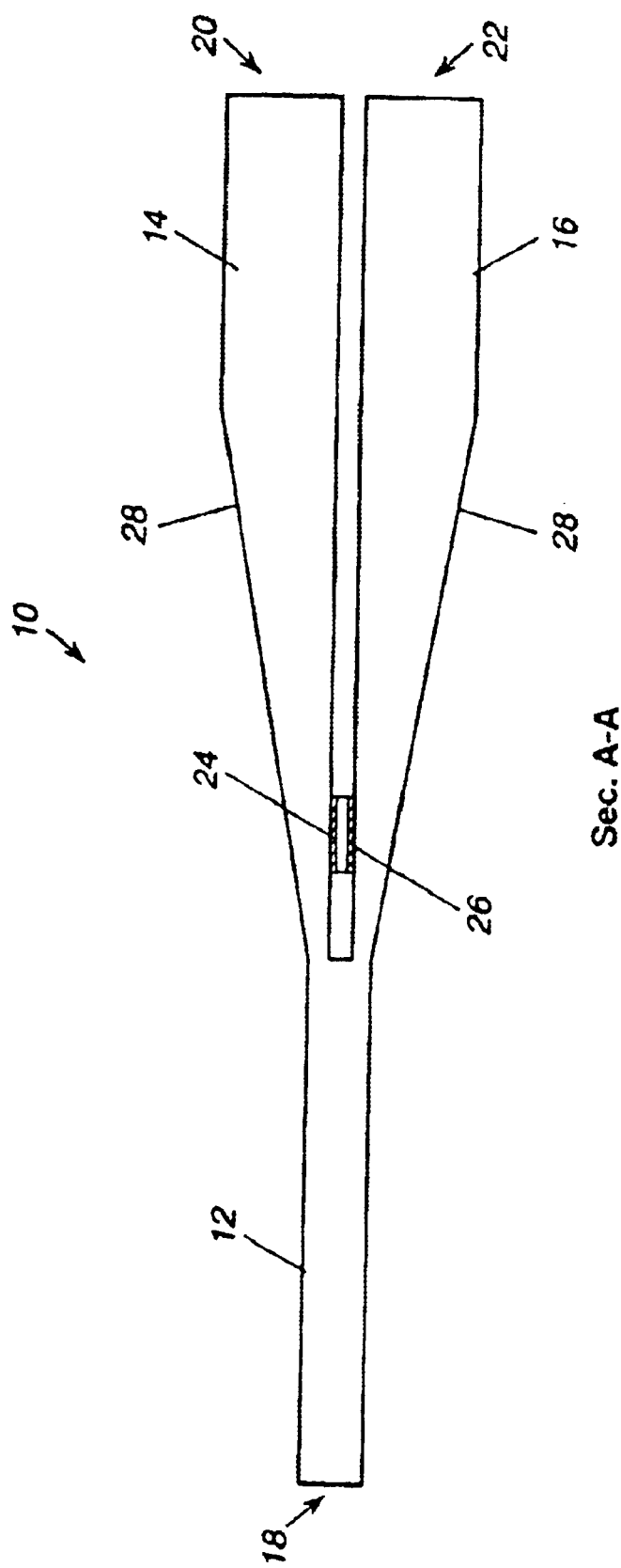
FIG. 2 is a cross-sectional view, taken along line A—A of FIG. 1 of a waveguide power divider in accordance with the present invention.
Figure 3:
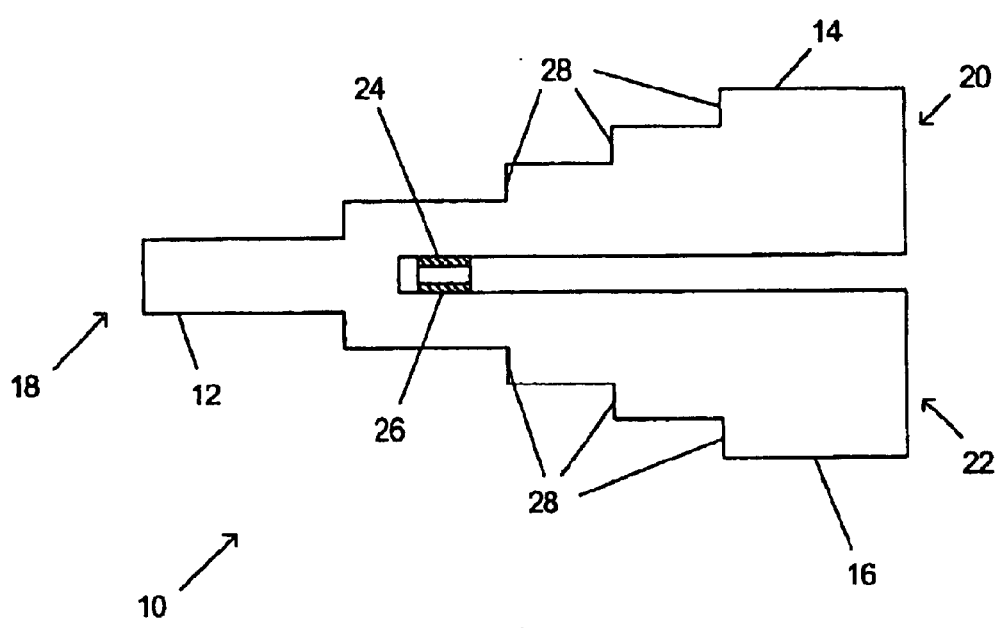
FIG. 3 is a cross-sectional view, taken along line A—A of another implementation of the waveguide power divider of FIG. 1 in accordance with the present invention.

Referring to FIGS. 1 and 2, the waveguide power divider of the present invention is illustrated and generally indicated as reference numeral 10. The waveguide power divider 10 comprises a primary waveguide 12 that transmits an input signal to two parallel waveguides, namely, the first parallel waveguide 14 and the second parallel waveguide 16. As shown, the parallel waveguides 14 and 16 are efficiently stacked on top of one another to reduce physical space requirements of the waveguide power divider 10. Further, the size, shape, and number of parallel waveguides may be varied according to specific application requirements. Accordingly, the use of two parallel waveguides as described herein shall not be construed as limiting the scope of the present invention.

As further shown, the primary waveguide 12 comprises an input port 18, and the stacked parallel waveguides 14 and 16 similarly comprise a first output port 20 and a second output port 22. Accordingly, a signal is transmitted through the input port 18 and is equally or non-equally split by the waveguide power divider 10 into two signals that are each transmitted though the first output port 20 and the second output port 22.

In order to increase isolation between the first output port 20 and the second output port 22, the waveguide power divider 10 further comprises resistive slots 24 and 26 as shown. The resistive slots 24 and 26 dissipate reflected power from the first output port 20 to the second output port 22, and as a result increase isolation between the output ports 20 and 22. The value of the resistance in each resistive slot 24 and 26 is not critical, as long as some value of resistance is employed. Further, the resistance in resistive slots 24 and 26 is preferably carried by a low dielectric material. Moreover, the size, shape, and number of resistive slots may be varied according to specific application requirements. Resistance values and corresponding improvements in isolation are described in greater detail below.

As further shown, the waveguide power divider 10 also comprises impedance steps 28 formed in each of the first parallel waveguide 14 and the second parallel waveguide 16. The impedance steps 28 perform a stepped impedance transformation or taper transformation on the signals transmitted through first parallel waveguide 14 and second parallel waveguide 16, thereby replacing conventional back-short tuning to provide wide band frequency matching on the first output port 20 and the second output port 22. Further, the size, shape, and number of impedance steps may be varied according to specific application requirements.

In preliminary testing, the waveguide power divider 10 in accordance with the teachings of the present invention resulted in improved isolation between the first output port 20 and the second output port 22, in addition to reduced signal losses. For example, using a commercial three-dimensional electromagnetic simulator with a topology at 44 GHz, the waveguide power divider 10 resulted in better than 25 dB isolation between the first output port 20 and the second output port 22 between 38 and 52 GHz. Furthermore, the waveguide power divider 10 resulted in better than 25 dB return loss and less than 0.25 dB insertion loss. Additionally, the value of the resistance in the resistive slots 24 and 26 was approximately 600 Ohms and approximately 700 Ohms. The performance of the waveguide power divider 10 as described herein is the result of preliminary testing and the values disclosed shall not be construed as limiting the scope of the present invention.

In another form, the waveguide power divider 10 may be configured as a waveguide power combiner rather than a power divider. Accordingly, the first output port 20 and the second output port 22 serve as input ports, and the input port 18 serves as an output port. Further, the resistive slots 24 and 26, in addition to the impedance steps 28, are similarly employed for performance enhancements as previously described.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An inline waveguide power divider comprising:
   a primary waveguide;
   a first parallel waveguide in communication with the primary waveguide; and
   a second parallel waveguide stacked on top of the first parallel waveguide and in communication with the primary waveguide;
   wherein the first parallel waveguide comprises only one resistive slot that dissipates reflected power from the first parallel waveguide;
   wherein the second parallel waveguide comprises only one resistive slot that dissipates reflected power from the second parallel waveguide;
   wherein the waveguide power divider transmits an input signal through the primary waveguide and splits the signal equally or non-equally between the first parallel waveguide and the second parallel waveguide.

2. The inline waveguide power divider of claim 1, wherein the first parallel waveguide comprises a first output port and the second parallel waveguide comprises a second output port
   wherein the primary waveguide, the first output port, and the second output port are substantially parallel to each other.

3. The inline waveguide power divider of claim 2 wherein the only one resistive slot of the first parallel waveguide and the only one resistive slot of the second parallel waveguide comprise a single, shared resistive slot.

4. The inline waveguide power divider of claim 1 wherein the first parallel waveguide comprises a first output port and the second parallel waveguide comprises a second output port, and the waveguide power divider further comprises:
   at least one impedance transformation formed in the waveguide power divider that matches frequencies on the first output port and the second output port.

5. The inline waveguide power divider of claim 4 further comprising:
   three impedance transformations formed in the first parallel waveguide; and
   three impedance transformations formed in the second parallel waveguide.

6. The inline waveguide power divider of claim 1, wherein the waveguide power divider transmits the input signal through the primary waveguide and splits the signal equally between the first parallel waveguide and the second parallel waveguide.

7. The inline waveguide power divider of claim 1, wherein the waveguide power divider transmits the input signal through the primary waveguide and splits the signal non-equally between the first parallel waveguide and the second parallel waveguide.

8. The inline waveguide power divider of claim 1, wherein the inline waveguide power divider employs the only one resistive slot of the first parallel waveguide to passively dissipate the reflected power from the first parallel waveguide;
   wherein the inline waveguide power divider employs the only one resistive slot of the second parallel waveguide to passively dissipate the reflected power from the second parallel waveguide.

9. The inline waveguide power divider of claim 1, wherein the only one resistive slot of the first parallel waveguide is embedded within a wall of the first parallel waveguide;
   wherein the only one resistive slot of the second parallel waveguide is embedded within a wall of the second parallel waveguide.

10. A method of dividing power in an inline waveguide, the method comprising the steps of:
    (a) transmitting an input signal through a first waveguide;
    (b) splitting the input signal between a first parallel waveguide having a first output port and a second parallel waveguide having a second output port, wherein the first parallel waveguide is stacked on top of the second parallel waveguide, wherein the first output port and the second output port comprise parallel output ports;
    (c) transmitting the split signal from the first parallel waveguide to only one resistive slot of the first parallel waveguide; and
    (d) transmitting the split signal from the second parallel waveguide to only one resistive slot of the second parallel waveguide, wherein the resistive slot of the first parallel waveguide dissipates reflected power from the first output port;

wherein the resistive slot of the second parallel waveguide dissipates reflected power from the second output port.

11. The method of claim 10 further comprising the step of transmitting the split signals through at least one impedance transformation to match frequencies on the first output port and the second output port.

12. The method of claim 11 further comprising the step of transmitting the split signals through three impedance transformations on the first parallel waveguide and three impedance transformations on the second parallel waveguide.

13. The method of claim 10, wherein the step of transmitting the split signal from the first parallel waveguide to the only one resistive slot of the first parallel waveguide comprises the step of:

transmitting the split signal from the first parallel waveguide to a shared resistive slot of the first parallel waveguide and the second parallel waveguide;

wherein the step of transmitting the split signal from the second parallel waveguide to the only one resistive slot of the second parallel waveguide comprises the step of:

transmitting the split signal from the second parallel waveguide to the shared resistive slot of the first parallel waveguide and the second parallel waveguide.

14. An inline waveguide power divider comprising:

a primary waveguide;

a first parallel waveguide in communication with the primary waveguide and comprising a first output port;

a second parallel waveguide stacked on top of the first parallel waveguide and in communication with the primary waveguide, the second parallel waveguide comprising a second output port;

only one resistive slot formed in the first parallel waveguide;

only one resistive slot formed in the second parallel waveguide;

at least one impedance transformation formed in the first parallel waveguide; and at least one impedance transformation formed in the second parallel waveguide, wherein the waveguide power divider transmits an input signal through the primary waveguide and splits the signal between the first parallel waveguide and the second parallel waveguide, the resistive slots dissipate reflected power from the first output port to the second output port, and the impedance transformations match frequencies on the first output port and the second output port.

15. The inline waveguide power divider of claim 14 further comprising:

three impedance transformations formed in the first parallel waveguide; and three impedance transformations formed in the second parallel waveguide.

16. The inline waveguide power divider of claim 14, wherein the resistive slot formed in the first parallel waveguide and the resistive slot formed in the second parallel waveguide comprise a same resistive slot.

17. An inline waveguide power divider and combiner comprising:

a primary waveguide;

a first parallel waveguide in communication with the primary waveguide; and a second parallel waveguide stacked on top of the first parallel waveguide and in communication with the primary waveguide, wherein the first parallel waveguide comprises only one resistive slot that dissipates reflected power from the first parallel waveguide;

wherein the second parallel waveguide comprises only one resistive slot that dissipates reflected power from the second parallel waveguide;

wherein the primary waveguide is operable to split an input signal between the first parallel waveguide and the second parallel waveguide, and to combine input signals received from the first parallel waveguide and the second parallel waveguide.

18. An inline waveguide power combiner comprising:

a primary waveguide;

a first parallel waveguide in communication with the primary waveguide and comprising a first input port;

a second parallel waveguide stacked on top of the first parallel waveguide and in communication with the primary waveguide, the second parallel waveguide comprising a second input port;

only one resistive slot formed in the first parallel waveguide;

only one resistive slot formed in the second parallel waveguide;

at least one impedance transformation formed in the first parallel waveguide; and at least one impedance transformation formed in the second parallel waveguide, wherein the waveguide power combiner combines input signals from the first parallel waveguide and the second parallel waveguide to the primary waveguide, the resistive slots dissipate reflected power from the first input port to the second input port, and the impedance transformations match frequencies on the first input port and the second input port.

19. The inline waveguide power combiner of claim 18 further comprising:

three impedance transformations formed in the first parallel waveguide; and three impedance transformations formed in the second parallel waveguide.

20. A method of combining power in an inline waveguide, the method comprising the steps of:

(a) transmitting a signal through a first parallel waveguide having a first input port and a signal through a second parallel waveguide having a second input port, wherein the first parallel waveguide is stacked on top of the second parallel waveguide;

(b) transmitting the signal in the first waveguide to a single resistive slot of the first waveguide;

(c) transmitting the signal in the second waveguide to a single resistive slot of the second waveguide; and (d) combining the signals to a primary waveguide, wherein the single resistive slots dissipate reflected power from the first input port and the second input port.

21. The method of claim 20 further comprising the step of transmitting the signals in the parallel waveguides through at least one impedance transformation to match frequencies on the first input port and the second input port.

22. The method of claim 21 further comprising the step of transmitting the signals in the parallel waveguides through three impedance transformations on the first parallel waveguide and through three impedance transformations on the second parallel waveguide.

23. An inline waveguide power combiner comprising:

a primary waveguide;

a first parallel waveguide in communication with the primary waveguide; and a second parallel waveguide stacked on top of the first parallel waveguide and in communication with the primary waveguide, wherein the first parallel waveguide comprises only one resistive slot that dissipates power reflected from the first output port;

wherein the second parallel waveguide comprises only one resistive slot that dissipates power reflected from the second output port;

wherein the waveguide power combiner combines input signals from the first parallel waveguide and the second parallel waveguide to the primary waveguide.

24. The inline waveguide power combiner of claim 23, wherein the first parallel waveguide comprises a first input port and the second parallel waveguide comprises a second input port wherein the first input port, the second input port, and the primary waveguide are substantially parallel to each other.

25. The inline waveguide power combiner of claim 24 wherein the only one resistive slot of the first parallel waveguide and the only one resistive slot of the second parallel waveguide comprise a same resistive slot.

26. The inline waveguide power combiner of claim 23 wherein the first parallel waveguide comprises a first input port and the second parallel waveguide comprises a second input port, and the waveguide power combiner further comprises:

at least one impedance transformation formed in the waveguide power combiner that matches frequencies on the first input port and the second input port.

27. The inline waveguide power combiner of claim 26 further comprising:

three impedance transformations formed in the first parallel waveguide; and three impedance transformations formed in the second parallel waveguide.

* * * * *